United States Patent [19]

Puckette et al.

[11] 4,156,233

[45] May 22, 1979

[54] CHARGE TRANSFER CIRCUIT WITH LEAKAGE CURRENT COMPENSATING MEANS

[75] Inventors: Charles M. Puckette; Walter J. Butler, both of Scotia, N.Y.

[73] Assignee: General Electric Company, Schenectady, N.Y.

[21] Appl. No.: 852,240

[22] Filed: Nov. 17, 1977

Related U.S. Application Data

[63] Continuation-in-part of Ser. No. 842,403, Oct. 17, 1977.

[51] Int. Cl.² .................................... H03K 13/20
[52] U.S. Cl. ..................... 340/347 AD; 340/347 CC; 340/347 NT
[58] Field of Search ............... 340/347 AD, 347 NT, 340/347 M, 347 CC; 324/99 D, 99 R; 302/221 D

[56] References Cited

U.S. PATENT DOCUMENTS

| | | | |
|---|---|---|---|
| 3,414,807 | 12/1968 | Evans | 324/99 D |
| 3,439,272 | 4/1969 | Bailey | 324/99 R |
| 4,070,667 | 1/1978 | Eichelberger | 340/347 AD |
| 4,074,260 | 2/1978 | Butler | 340/347 AD |

OTHER PUBLICATIONS

Heller, "IBM Technical Disclosure Bulletin", vol. 20, No. 5, Oct. 1977, pp. 2072-2073.

Primary Examiner—Charles D. Miller
Attorney, Agent, or Firm—Geoffrey H. Krauss; Joseph T. Cohen; Marvin Snyder

[57] ABSTRACT

A monolithic analog to digital converter having leakage current compensating circuitry is disclosed. First and second charge storage capacitors are formed in a single semi-conductor substrate. An analog signal to be converted and a reference signal are simultaneously applied to the first and second capacitors, respectively. Thereafter, a charge transfer circuit supplies the first capacitor with a plurality of discrete charge packets. The polarity of the charge packets is chosen so as to increase or decrease the voltage across the first capacitor in the direction of the voltage across the second capacitor. When the voltage across the two capacitors become equal, a differential comparator generates an output signal indicating the end of a conversion operation. The parameters of the first and second capacitors are chosen such that the amount of charge added to or subtracted from the second capacitor due to a thermally induced leakage current in the substrate is substantially equal to the amount of charge added to or subtracted from the first capacitor as the result of the thermally induced leakage current.

6 Claims, 3 Drawing Figures

CHARGE TRANSFER CIRCUIT WITH LEAKAGE CURRENT COMPENSATING MEANS

BACKGROUND OF THE INVENTION

This application is a continuation-in-part of pending U.S. patent application Ser. No. 842,403, filed Oct. 17, 1977.

The present invention is related to a leakage current compensating circuit for a charge transfer analog to digital circuit. The basic principle behind charge transfer analog to digital converters is that the number of discrete charge packets required to increase the voltage across a storage device, such as a capacitor, from a first value representative of the analog signal being converted to a second reference value is proportional to the magnitude of the analog signal. Accordingly, by counting the number of charge packets transferred by the charge transfer device to the charge storage element, it is possible to obtain a digital representation of the analog voltage being converted. Charge transfer analog to digital converters of the foregoing type are exemplified by U.S. patent application Ser. No. 628,542, filed Nov. 3, 1975 now abandoned and assigned to the assignee of the present application.

In the foregoing application, a signal proportional to the analog signal being converted is applied to a charge storage capacitor. During each of a plurality of charge transfer operations, a metered charge packet is added to the capacitor by a charge transfer device such as a bucket brigade circuit. Since the magnitude of each metered charge packet is ideally constant, the number of metered charge packets required to change the voltage across the capacitor from the voltage representative of the signal to be converted to a reference voltage is ideally a function of the magnitude of the analog signal being converted.

The foregoing relationship is modified in actual application by a thermally- or optically-induced leakage current in the semi-conductor substrate in which the capacitor and charge transfer device are preferably formed. This leakage current effects both the magnitude of the charge packets transferred to the capacitor during each charge transfer operation and the total amount of charge stored by the capacitor at the end of the plurality of charge transfer operations. During each charge transfer operation, some of the charge transferred to the capacitor by the charge transfer device is lost to (or gained from, depending upon the type of substrate used) the substrate in the form of a thermally- or photon-induced leakage current. Additionally, charge accumulated in the capacitor is continually lost to (or gained from) the substrate throughout the conversion process. Since the magnitude of the thermally induced leakage current varies with temperature, the number of charge packets required to change the voltage across the capacitor from a voltage representative of the signal to be converted to the reference voltage varies with varying substrate temperature. Such variations result in inaccurate measurements. The present invention is designed to account for these changes so as to provide a temperature insensitive output. In addition, the invention accounts for similar changes which would otherwise occur as a result of variations in ambient light levels.

BRIEF SUMMARY OF THE INVENTION

The foregoing shortcomings of the prior art are overcome in the present invention by varying the reference voltage to which the first capacitor is charged in a manner which closely simulates variations in the voltage across the first capacitor due to substrate leakage current. Particularly, by applying the reference voltage to a second capacitor which is formed in the same substrate as the first capacitor, the charge lost to (or gained from) the substrate by the first capacitor will be compensated for by a similar loss (or gain) in charge in the second capacitor.

In a preferred embodiment, first and second charge storage capacitors are formed in the single semi-conductor substrate. An analog signal to be converted and a reference signal are simultaneously applied to the first and second capacitors, respectively. Thereafter, a charge transfer circuit supplies the first capacitor with a plurality of discrete charge packets. The polarity of the charge packets is chosen to increase or decrease the voltage across the first capacitor in the direction of the voltage across the second capacitor. When the voltage across the two capacitors becomes equal, a differential comparator generates an output signal indicating the end of a conversion operation. The parameters of the first and second capacitors are chosen such that the amount of charge added to or subtracted from the second capacitor due to thermally induced leakage current in the substrate is substantially equal to the amount of charge added to or substracted from the first capacitor as a result of the thermally induced leakage current.

BRIEF DESCRIPTION OF THE DRAWINGS

For the purpose of illustrating the invention, there is shown in the drawings several embodiments which are presently preferred; it being understood, however, that this invention is not limited to the precise arrangements and instrumentalities shown.

DETAILED DESCRIPTION OF THE INVENTION

Figure 1:
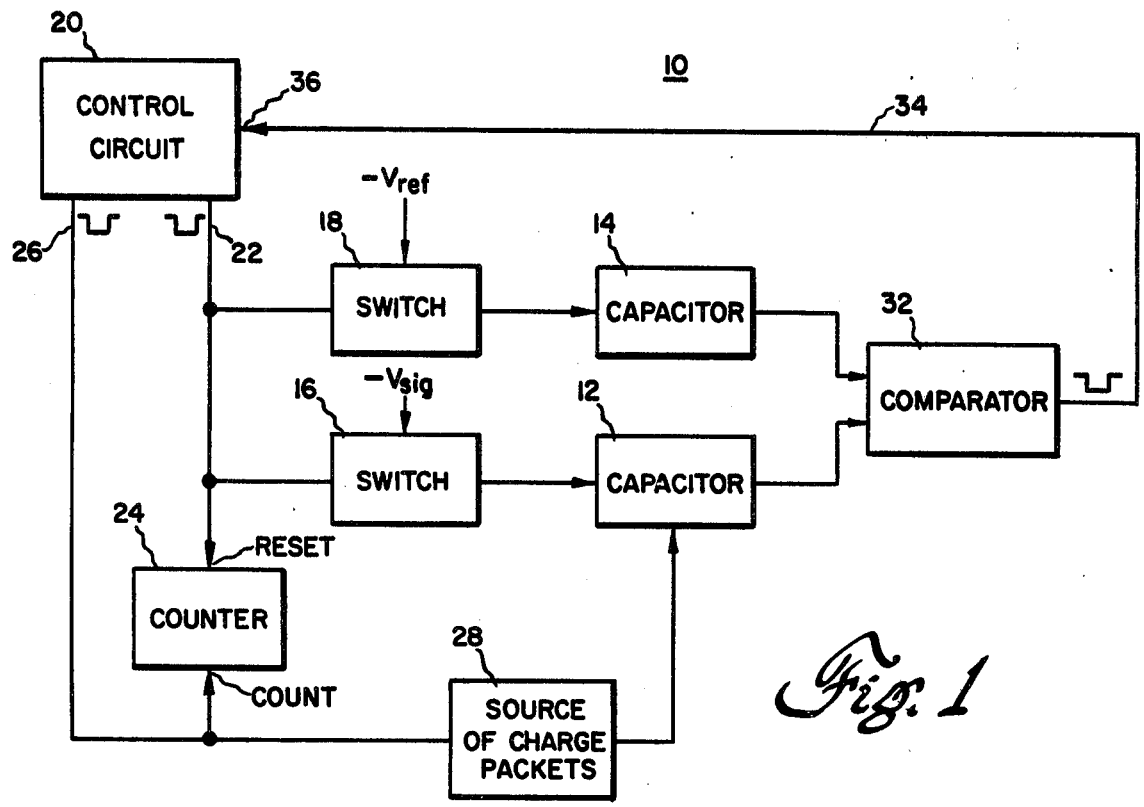
FIG. 1 is a block diagram of an analog to digital converter constructed in accordance with the principles of the present invention.
Figure 2:
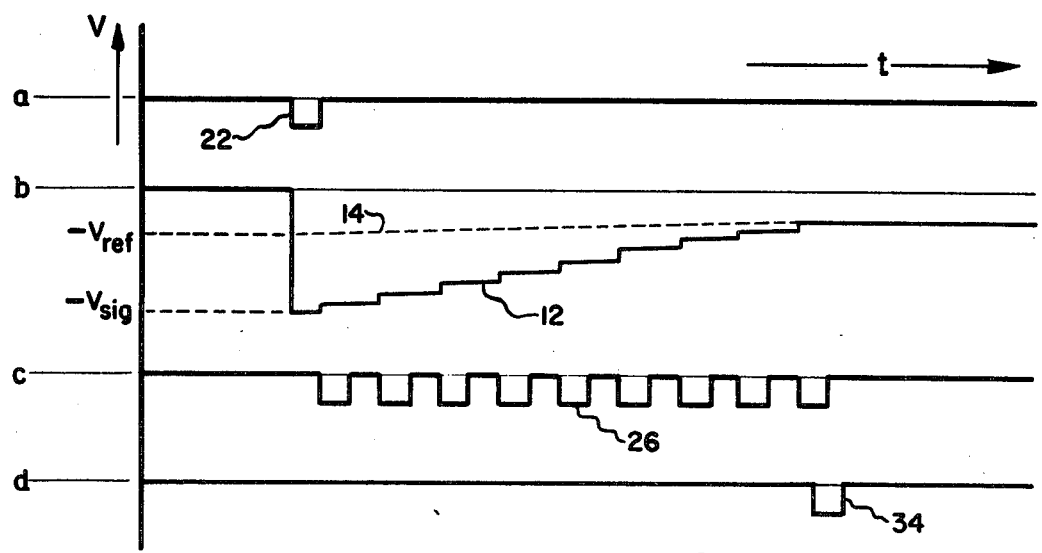
FIG. 2 is a set of coordinated waveforms illustrating signals appearing at various locations in the block diagram of FIG. 1.

Referring now to the drawings wherein like numerals indicate like elements, there is shown in FIG. 1 an analog to digital converter constructed in accordance with the principles of the present invention and designated generally as 10. Analog to digital convertor circuit 10 includes first and second charge storage capacitors 12 and 14 which are preferably formed in a single semi-conductor substrate. At the initiation of an analog to digital conversion operation, control circuit 20 generates an enabling pulse on line 22, causing switches 16 and 18 to simultaneously apply an analog signal $-V_{sig}$ (proportional to the voltage to be converted) and a reference signal $-V_{ref}$ to capacitors 12 and 14, respectively. See FIG. 2, waveforms a and b. The enabling pulse on line 22 (waveform a) also resets the count in counter 24. After enabling switches 16 and 18, circuit 20 generates a plurality of enabling pulses (FIG. 2, waveform c) on line 26 causing charge packet source 28 to apply a series of charge packets to capacitor 12 and simultaneously increasing the count in counter 24. More particularly, each time another enabling pulse is generated by control circuit 20, the count in counter 24 increases by 1 and another discrete charge packet is applied to capacitor 12 by charge packet source 28. The charge packets supplied by charge packet source 28 may be either positive or negative in polarity. However, the plurality must be chosen so that the voltage across capacitor 12 either increases or decreases in the direction of the charge across capacitor 14.

Each packet of charge supplied by source 28 has a first component which is a function of the parameters of the internal circuit of the source and a second component which is a function of the thermally induced leakage current. Accordingly, the amount of charge added to capacitor 12 by each packet varies as a function of the substrate temperature. Additionally, charge will be added to capacitor 12 directly from the substrate. Accordingly, the total amount of charge added to capacitor 12 after a plurality of charge packets have been generated by source 28 is a function of both the constant quantum of charge independently generated by the source 28 and the thermally induced leakage current. This phenomena is graphically illustrated in FIG. 2, waveform b, where line 12 represents the voltage across capacitor 12 and line 14 represents the voltage across capacitor 14. The step increases in line 12 are due to the charge added to capacitor 12 by source 28 and the slowly increasing voltage between the steps is the result of the leakage current.

As noted above, capacitor 14 is formed in the same semi-conductor substrate as capacitor 12. Additionally, the parameters of capacitor 14 are chosen such that the amount of charge added to or subtracted from capacitor 14 due to the thermally induced leakage current is approximately equal to the amount of charge added to or subtracted from capacitor 12 as a result of the thermally induced leakage current. This is shown graphically in FIG. 2, waveform b, wherein line 14, representing the voltage across capacitor 14, slowly increases with time due to the substrate leakage current. As a result of this relationship, operation of analog to digital converter 10 is substantially temperature independent.

Returning now to FIG. 1, when the voltage across capacitor 12 increases (decreases) to a value equal to the voltage across capacitor 14, comparator 32 generates a stop pulse (see FIG. 2a, waveform d) on line 34 causing control circuit 20 to stop gating source 28 and to stop up-counting counter 24. At this point, the count in counter 24 provides a digital representation of the analog signal being converted.

Figure 3:
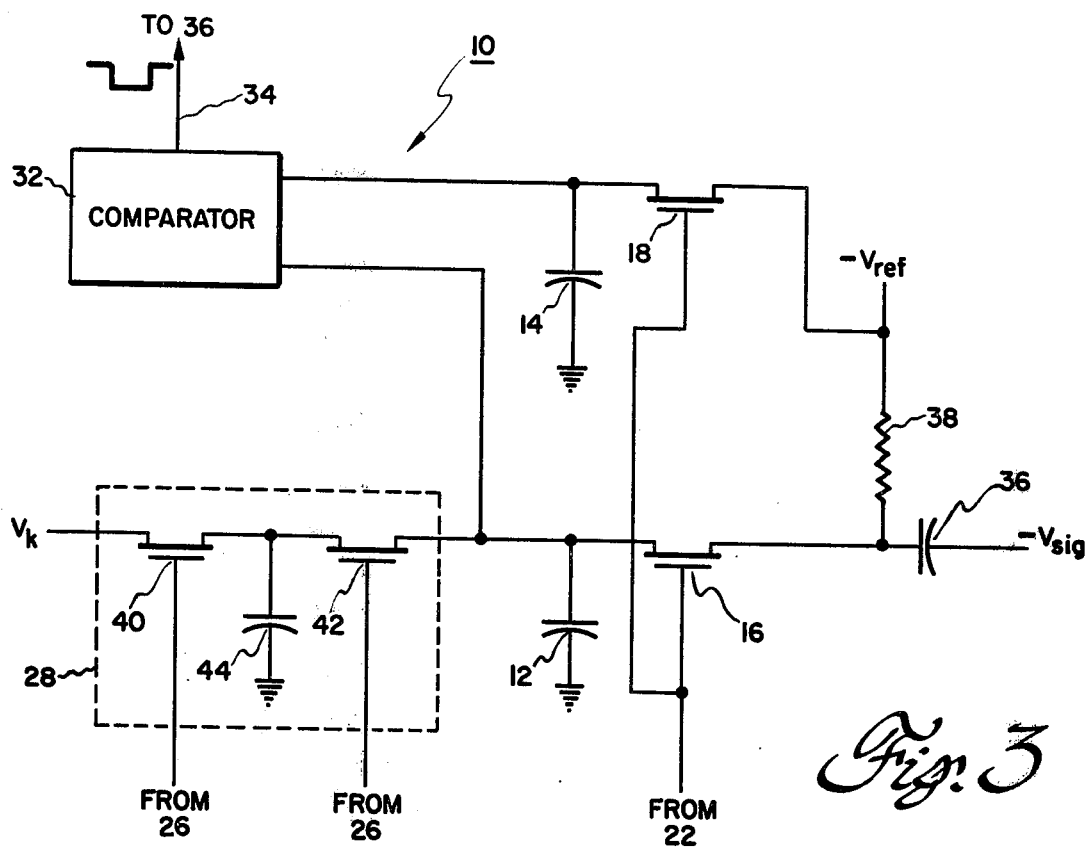
FIG. 3 is a circuit diagram of a portion of the analog to digital converter of FIG. 1.

A circuit diagram of a portion of the analog to digital converter of FIG. 1 is illustrated in FIG. 3. As shown therein, switches 16 and 18 are preferably MOSFETs which are formed in the same semi-conductor substrate as capacitors 12 and 14. The signal to be converted $-V_{sig}$ is applied to the source of transistor switch 16 through coupling capacitor 36 and a biasing network comprising resistor 38. Resistor 38 cooperates with reference voltage $-V_{ref}$ to position the expected range of the variation of the input signal $-V_{sig}$ within the dynamic range window of the analog to digital converter 10. It is assumed that the signal $-V_{sig}$ does not have any D.C. component thereby allowing the capacitor 36 to be used for level transition. If a D.C. or low frequency component is present, the capacitor 36 must be replaced by other level translation means, and resistor 38 may also be affected; a differential amplifier, having the signal and reference voltages coupled to one and the other inputs, may be utilized to avoid this problem.

At the beginning of a conversion process, an enabling pulse is generated by control circuit 20 and applied to the gates of transistor switches 16 and 18. As a result, a signal representative of the analog signal $-V_{sig}$ to be converted is applied across capacitor 12 and the reference voltage $-V_{ref}$ is applied across capacitor 14. Thereafter, charge packet source 28 supplies a plurality of discrete charge packets to capacitor 12. In the embodiment illustrated in FIG. 3, the source 28 comprises a bucket brigade circuit of the type well known in the art. Other charge sources, such as the charge pump described in U.S. Pat. No. 3,819,954, may also be used. The bucket brigade charge transfer circuit of FIG. 3 includes a first MOSFET transistor 40 biased to operate as a switch and a second MOSFET transistor 42 biased to operate as a "shelf" transistor. During a first clock period, a gating pulse is applied to the gate of transistor 40 applying the analog voltage $V_k$ across capacitor 44. During the next clock period, a gating pulse is applied to the gate of transistor 42 causing charge to transfer from capacitor 44 to capacitor 12 until the voltage across capacitor 44 decreases to a value equal to the gate voltage applied to transistor 42 less the threshold voltage of the transistor.

The net effect of the foregoing operation is to increase the voltage across capacitor 12 by an amount:

$$\Delta V = (V_g - V_t - V_k)/K + Q_o/C_{12} \qquad (1)$$

where $V_t$ is the threshold voltage of transistor 42, K is the ratio of capacitance of capacitors 44 and 12, respectively, $Q_o$ is the substrate leakage charge and $C_{12}$ is the capacitance of capacitor 12. In the above equation, the first term is a voltage increment due to the charge packet and the second term is a voltage increment due to substrate leakage charge. It should be noted at this point, that the charge transferred from capacitor 44 to capacitor 12 will be either positive or negative depending upon the type of MOSFET transistor utilized. If a p-channel MOSFET is used, positive charge will be transferred from capacitor 44 to capacitor 12. If a n-channel is used, negative charge will be transferred from capacitor 44 to capacitor 12. In the embodiment illustrated, it is assumed that p-channel MOSFETs are used. In addition to the foregoing, capacitor 12 is constantly receiving additional charge directly from the substrate in the form of thermally-induced or photon-induced leakage charge.

To offset the charge added to capacitor 12 by such leakage current, the parameters of capacitor 14 are chosen such that the voltage across capacitor 14 will increase at a rate which is substantially identical to the increase in the voltage across capacitor 12 due to similar substrate leakage current. Accordingly, the relative increase in charge across capacitor 12 with respect to the charge across capacitor 14 will be primarily a function of the operation of switch 42 and independent of substrate leakage current.

When a sufficient number of charge packets have been applied to capacitor 12, the voltage across capacitor 12 reaches the voltage across capacitor 14 and comparator 32 generates an output pulse on line 34. Control circuit 20 stops gating source 28 and the count in counter 24 provides an accurate digital representation of a magnitude of the analog signal $-V_{sig}$.

In the above described embodiment, the reference voltage $-V_{ref}$ was chosen to be less negative than the analog voltage $-V_{sig}$ and the charge packets were applied to capacitor 12. Alternatively, the reference voltage could have been chosen to be more negative than the analog voltage and the charge packets could have been applied to capacitor 14. Other variations will be apparent to those skilled in the art in view of the above description of the present invention.

The present invention may be embodied in other specific forms without departing from the spirit or essential attributes thereof and, accordingly, reference should be made to the appended claims, rather than to the foregoing specification as indicating the scope of the invention.

What is claimed is:

1. An analog to digital converter comprising:

a semi-conductor substrate;

first and second charge storage capacitors formed in said substrate;

means for simultaneously applying an analog signal and a reference signal respectively to said first and second capacitors;

charge supply means for supplying a succession of charge packets of a single polarity to only said first capacitor, the polarity of said charge packets being defined such that the voltage across said first capacitor is either increased or decreased in a single direction toward the voltage across the second capacitor each time another charge packet is applied to said first capacitor;

comparator means having first and second inputs respectively coupled to said first and second capacitors for differentially comparing the voltages across said first and second capacitors and for generating an output signal when the voltage across said first capacitor becomes equal in magnitude to the voltage across said second capacitor;

the parameters of said first and second capacitors being chosen such that the amount of charge added to or subtracted from said first capacitor due to at least one of a thermally-induced and an optically-induced leakage current in said semi-conductor substrate is substantially equal to the amount of charge added to or subtracted from said second capacitor due to said at least one of said thermally-induced and optically-induced leakage current.

2. The apparatus of claim 1 wherein said means for simultaneously applying an analog signal and a reference signal respectively to said first and second capacitors comprises:

a first electronic switch for applying said analog signal to said first capacitor when a gating pulse is applied thereto;

a second electronic switch for applying said reference signal to said second capacitor when a gating pulse is applied thereto; and means for simultaneously applying said gating pulses to said first and second electronic switches.

3. The circuit of claim 2 wherein said first and second electronic switches are MOSFETs.

4. The circuit of claim 1 wherein said means for supplying charge packets comprises a bucket brigade charge transfer circuit.

5. The circuit of claim 1 wherein all of the elements of said circuit are formed in a single semi-conductor substrate.

6. The circuit of claim 1, further comprising counter means for counting the number of charge packets supplied to said one of said capacitors, the count in said counter means being initiated at the commencement of charge packet supply and terminated by the presence of said output signal.

* * * * *